US010971956B2

(12) United States Patent
Ahn et al.

(10) Patent No.: US 10,971,956 B2
(45) Date of Patent: Apr. 6, 2021

(54) LEAKAGE MAGNETIC FIELD SHIELDING DEVICE AND WIRELESS POWER TRANSMISSION SYSTEM INCLUDING THE SAME

(71) Applicants: Korea Advanced Institute of Science and Technology, Daejeon (KR); University-Industry Cooperation Group of Kyung Hee University, Yongin-si (KR)

(72) Inventors: Seungyoung Ahn, Daejeon (KR); Jaehyoung Park, Daejeon (KR); Bomson Lee, Yongin-si (KR); Hongkyun Kim, Daejeon (KR)

(73) Assignees: Korea Advanced Institute of Science and Technology, Daejeon (KR); University-Industry Cooperation Group of Kyung Hee University, Yongin-si (KR)

( * ) Notice: Subject to any disclaimer, the term of this patent is extended or adjusted under 35 U.S.C. 154(b) by 50 days.

(21) Appl. No.: 16/566,595

(22) Filed: Sep. 10, 2019

(65) Prior Publication Data
US 2020/0083756 A1  Mar. 12, 2020

(30) Foreign Application Priority Data
Sep. 12, 2018  (KR) .......................... 10-2018-0109213

(51) Int. Cl.
*H02J 50/70* (2016.01)
*H02J 50/12* (2016.01)
(Continued)

(52) U.S. Cl.
CPC .............. *H02J 50/70* (2016.02); *G01R 33/02* (2013.01); *H02J 50/12* (2016.02); *H02J 50/40* (2016.02); *H05K 9/0071* (2013.01)

(58) Field of Classification Search
CPC . H02J 60/12; H02J 60/40; H02J 60/70; G01R 33/02; H05K 9/0071
(Continued)

(56) References Cited
U.S. PATENT DOCUMENTS
2012/0235636 A1* 9/2012 Partovi ................... H02J 5/005
                                                                    320/108
2018/0138750 A1  5/2018 Suzuki et al.

FOREIGN PATENT DOCUMENTS
JP    2018-0138750 A    5/2018
KR    1020120082768 A   7/2012
(Continued)

OTHER PUBLICATIONS
Office Action dated Oct. 5, 2018, in corresponding Korean Application No. 10-2018-0109213, with machine translation; 13 pages.

*Primary Examiner* — Hal Kaplan
(74) *Attorney, Agent, or Firm* — Maier & Maier, PLLC

(57) ABSTRACT

A leakage magnetic field shielding device includes: a leakage magnetic field determining unit for determining phase and magnitude of a leakage magnetic field based on information obtained from a power supply device and a current collector device; a shielding current controller for determining a shielding current based on the phase and magnitude of the leakage magnetic field and supplying the determined shielding current to the leakage magnetic field shielding device; and a shielding unit for shielding the leakage magnetic field by generating a shielding magnetic field in accordance with the supply of the shielding current. The shielding unit has a multiple resonance characteristic depending on an arrangement of capacitors and coils and is disposed to surround the power supply device or the current collector device. The shielding magnetic field has resonance frequencies canceling magnetic fields corresponding to fun-
(Continued)

damental frequency and multiple frequency of the leakage magnetic field.

16 Claims, 7 Drawing Sheets

(51) Int. Cl.
    *H02J 50/40*     (2016.01)
    *G01R 33/02*     (2006.01)
    *H05K 9/00*     (2006.01)

(58) Field of Classification Search
    USPC .......................................................... 307/104
    See application file for complete search history.

(56) References Cited

FOREIGN PATENT DOCUMENTS

| KR | 1020120082770 A | 7/2012 |
|----|-----------------|--------|
| KR | 1020150034609 A | 4/2015 |

\* cited by examiner

LEAKAGE MAGNETIC FIELD SHIELDING DEVICE AND WIRELESS POWER TRANSMISSION SYSTEM INCLUDING THE SAME

CROSS-REFERENCE TO RELATED APPLICATION

This application claims priority to Korean Patent Application No. 10-2018-0109213, filed on Sep. 12, 2018, the entire contents of which are incorporated herein by reference.

FIELD

The present disclosure relates to a leakage magnetic field shielding device having multiple resonance characteristics and a wireless power transmission system including the same.

BACKGROUND

Recently, with the development of electronic technology, research on wireless charging technology has been actively conducted as a method for supplying electrical energy to electronic devices without a physical line for supplying power. Wireless charging technology is based on the principle of generating a magnetic field to transfer electrical energy wirelessly.

Meanwhile, a leakage magnetic field may occur in the process of generating a magnetic field and transmitting the electrical energy for wireless charging. The leakage magnetic field may have a negative effect on the human body and may cause a malfunction of other electronic devices in the vicinity of a device that is subject to wireless charging. Therefore, research on a method for reducing a leakage magnetic field is actively progressing.

Generally, in wireless charging, a leakage magnetic field occurs in frequency components, e.g., multiple frequency components, other than the fundamental frequency used for wireless charging. However, at present, most leakage magnetic field reduction methods consider the reduction of the leakage magnetic field occurring in the fundamental frequency without considering the multiple frequency. Accordingly, there is a need for a method for effectively reducing the leakage magnetic field by considering other frequency components in addition to the fundamental frequency component used for wireless charging.

SUMMARY

The present disclosure provides a leakage magnetic field shielding device and a wireless power transmission system that effectively reduce multiple frequency of a leakage magnetic field by using multiple resonance characteristics.

In accordance with an aspect of the present disclosure, there is provided a leakage magnetic field shielding device comprising: a leakage magnetic field determining unit configured to determine a phase and a magnitude of a leakage magnetic field based on information obtained from each of a power supply device and a current collector device; a shielding current controller configured to determine a shielding current based on the phase and the magnitude of the leakage magnetic field and to supply the determined shielding current to the leakage magnetic field shielding device; and a shielding unit configured to shield the leakage magnetic field by generating a shielding magnetic field in accordance with the supply of the shielding current, wherein the shielding unit has a multiple resonance characteristic depending on an arrangement of a capacitor and a coil included in the shielding unit and is disposed to surround a coil of the power supply device or a coil of the current collector device, and the shielding magnetic field has a plurality of resonance frequencies canceling each of magnetic fields corresponding to a fundamental frequency and a multiple frequency of the leakage magnetic field based on the multiple resonance characteristic of the shielding unit.

In accordance with another aspect of the present disclosure, there is provided a wireless power transmission system comprising: a power supply device including a coil, the power supply device serving to generate a primary magnetic field when current is applied to the coil of the power supply device; a current collector device including a coil, the current collector device serving to receive a power by an induction voltage induced at both ends of the coil of the current collector device by the generated primary magnetic field; and a leakage magnetic field shielding device which comprises: a leakage magnetic field determining unit configured to determine a phase and a magnitude of a leakage magnetic field based on information obtained from each of the power supply device and the current collector device; a shielding current controller configured to determine a shielding current based on the phase and the magnitude of the leakage magnetic field and to supply the determined shielding current to the leakage magnetic field shielding device; and a shielding unit configured to shield the leakage magnetic field by generating a shielding magnetic field in accordance with the supply of the shielding current, wherein the shielding unit has a multiple resonance characteristic depending on an arrangement of a capacitor and a coil included in the shielding unit and is disposed to surround a coil of the power supply device or a coil of the current collector device, and the shielding magnetic field has a plurality of resonance frequencies canceling each of magnetic fields corresponding to a fundamental frequency and a multiple frequency of the leakage magnetic field based on the multiple resonance characteristic of the shielding unit.

The shielding unit may include a first capacitor, a second capacitor, a first coil and a second coil, the first capacitor may be connected in series with the first coil, the second capacitor may be connected in parallel with the first capacitor and the first coil connected in series, and the first capacitor and the first coil, connected in series, and the second capacitor connected in parallel therewith may be connected in series with the second coil.

Alternatively, the shielding unit may include a first capacitor, a second capacitor, a first coil and a second coil, the first capacitor may be connected in series with the first coil, the second capacitor may be connected in series with the second coil, and the first capacitor and the first coil connected in series may be connected in parallel with the second capacitor and the second coil connected in series.

Further, the shielding unit may be disposed to surround the coil of the power supply device on a plane where the coil of the power supply device is disposed, and the power supply device may be positioned inside the shielding unit.

Further, the shielding unit may be disposed to surround the coil of the current collector device on a plane where the coil of the current collector device is disposed, and the current collector device may be positioned inside the shielding unit.

Further, the shielding unit may include a first shielding unit and a second shielding unit, the first shielding unit may be disposed to surround the coil of the power supply device on a plane where the coil of the power supply device is disposed, the power supply device being positioned inside the first shielding unit, and the second shielding unit may be disposed to surround the coil of the current collector device on a plane where the coil of the current collector device is disposed, the current collector device being positioned inside the second shielding unit.

Further, at least one of the first shielding unit and the second shielding unit may include a first capacitor, a second capacitor, a first coil and a second coil, the first capacitor may be connected in series with the first coil, the second capacitor may be connected in series with the second coil, and the first capacitor and the first coil connected in series may be connected in parallel with the second capacitor and the second coil connected in series.

Alternatively, at least one of the first shielding unit and the second shielding unit may include a first capacitor, a second capacitor, a first coil and a second coil, the first capacitor is connected in series with and the first coil, the second capacitor may be connected in parallel with the first capacitor and the first coil connected in series, and the first capacitor and the first coil, connected in series, and the second capacitor connected in parallel therewith may be connected in series with the second coil.

With such configurations, the leakage magnetic field shielding device is capable of generating a shielding magnetic field corresponding to a multiple frequency of the leakage magnetic field based on multiple resonance characteristics to effectively reduce the leakage magnetic field of multiple frequency components.

DETAILED DESCRIPTION OF THE EMBODIMENTS

Figure 1:
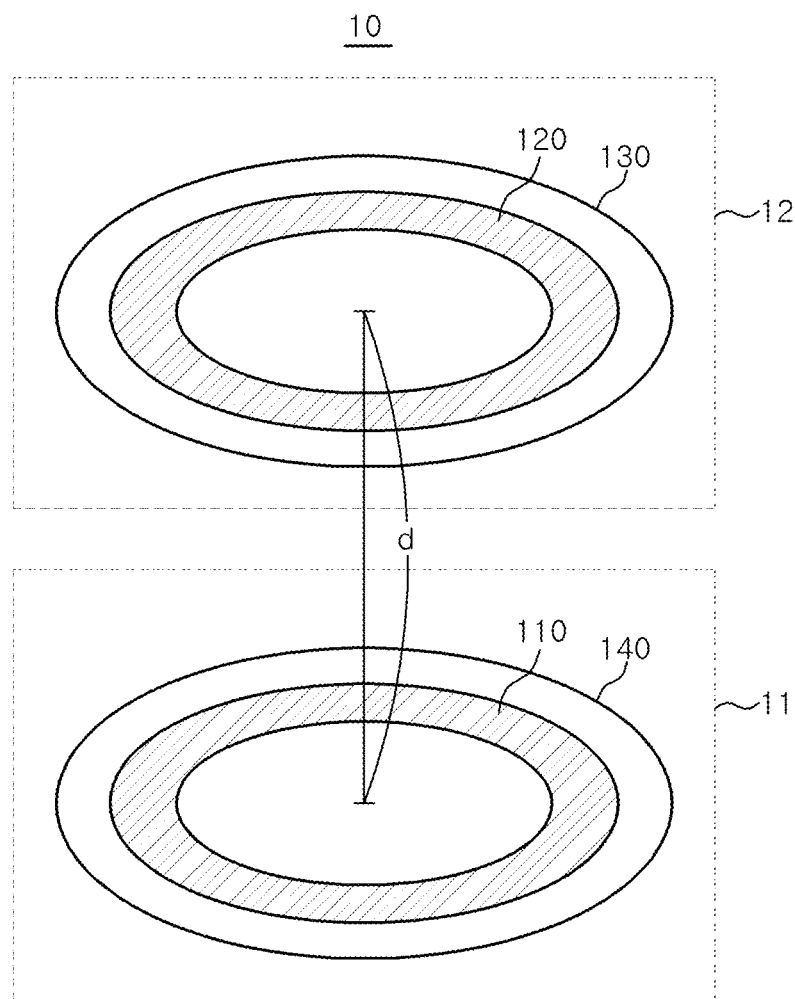
FIG. 1 is a conceptual diagram of a wireless power transmission system according to an embodiment of the present disclosure.

Hereinafter, configurations and operations of embodiments will be described in detail with reference to the accompanying drawings. The following description is one of various patentable aspects of the present disclosure and may form a part of the detailed description of the present disclosure.

However, in describing the present disclosure, detailed descriptions of known configurations or functions that make the present disclosure obscure may be omitted.

The present disclosure may be modified and include various embodiments. Specific embodiments will be exemplarily illustrated in the drawings and described in the detailed description of the embodiments. However, it should be understood that they are not intended to limit the present disclosure to specific embodiments but rather to cover all modifications, similarities, and alternatives that are included in the spirit and scope of the present disclosure.

The terms used herein, including ordinal numbers such as "first" and "second" may be used to describe, and not to limit, various components. The terms simply distinguish the components from one another.

When it is said that a component is "connected" or "linked" to another component, it should be understood that the former component may be directly connected or linked to the latter component or a third component may be interposed between the two components.

Specific terms in the present disclosure are used simply to describe specific embodiments without limiting the present disclosure. An expression used in the singular encompasses the expression of the plural, unless it has a clearly different meaning in the context.

FIG. 1 shows a conceptual diagram of a wireless power transmission system according to an embodiment of the present disclosure.

Referring to FIG. 1, the wireless power transmission system 10 includes a power supply unit 11 and a current collector unit 12. The power supply unit 11 includes a power supply device 110 and a first shielding device 140, and the current collector unit 12 includes a current collector device 120 and a second shielding device 130.

The power supply unit 11 and the current collector unit 12 may be separated by a predetermined distance d. Specifically, the power supply device 110 and the current collector device 120 may be disposed in separate devices located apart from each other. For example, the power supply device 110 may be disposed in a charging device, and the current collector device 120 may be disposed in a movable device (e.g., a car, a train, a mobile phone, a computer, etc.).

The power supply device 110 can supply electrical energy to the current collector device 120. Specifically, when a current is applied to the power supply device 110 by a power source (e.g., an AC power source), the power supply device 110 generates a magnetic field (e.g., a time-varying magnetic field).

The magnetic field generated by the power supply device 110 can transfer electrical energy to the current collector device 120. Specifically, electrical energy can be transmitted to the current collector device 120 by an induction voltage induced at the current collector device 120 by excitation of the primary magnetic field generated by the power supply device 110.

FIG. 1 shows the power supply device 110 having a circular shape, but the present disclosure is not limited thereto. The power supply device 110 may have various shapes such as a square and a rectangle.

The first shielding device 140 is positioned adjacent to the power supply device 110. Specifically, the first shielding device 140 may be positioned outside the power supply device 110 to surround the power supply device 110. The diameter of the first shielding device 140 is greater than that of the power supply device 110, but is disposed on the same plane such that the centers of the first shielding device 140 and the power supply device 110 coincide with each other.

The first shielding device 140 shields the leakage magnetic field leaked while the power is supplied from the power supply device 110 to the current collector device 120. Specifically, the first shielding device 140 shields the leakage magnetic field by generating a shielding magnetic field that cancels the leakage magnetic field.

The shielding magnetic field can be determined based on the magnitude and phase of the leakage magnetic field. For example, the sum of the magnitude of the shielding magnetic field generated by the first shielding device 140 and the magnitude of the shielding magnetic field generated by the second shielding device 130 described later is equal to the magnitude of the leakage magnetic field, and the phase of the leakage magnetic field and the sum of the phase of the shielding magnetic field generated by the first shielding device 140 and the phase of the shielding magnetic field generated by the second shielding device 130 have a phase-difference of 180°.

The current collector device 120 is configured to receive power from the power supply device 110. Specifically, an induction voltage is induced in the current collector device 120 by a magnetic field generated as a current flows through the power supply device 110. Accordingly, the current collector device 120 receives electric energy from the power supply device 110.

On the other hand, although not shown, the current collector device 120 may receive electrical energy and supply the electrical energy to a load using the electrical energy. Here, the load may be a device in which the current collector device 120 is installed, for example, a vehicle, a train, a mobile phone, or a computer itself or a component included therein to store or consume electrical energy.

FIG. 1 shows the current collector device 120 having a circular shape, but the present disclosure is not limited thereto. The current collector device 120 may have various shapes such as a square and a rectangle.

The second shielding device 130 is positioned adjacent to the current collector device 120. Specifically, the second shielding device 130 may be positioned outside the current collector device 120 to surround the current collector device 120. The diameter of the second shielding device 130 is greater than that of the current collector device 120, but is disposed on the same plane such that the centers of the second shielding device 130 and the current collector device 120 coincide with each other.

The second shielding device 130 shields the leakage magnetic field leaked while the power is supplied from the power supply device 110 to the current collector device 120. Specifically, the second shielding device 130 shields the leakage magnetic field by generating a shielding magnetic field that cancels the leakage magnetic field.

The shielding magnetic field can be determined based on the magnitude and phase of the leakage magnetic field. For example, the sum of the magnitude of the shielding magnetic field generated by the first shielding device 140 and the magnitude of the shielding magnetic field generated by the second shielding device 130 described later is equal to the magnitude of the leakage magnetic field, and the phase of the leakage magnetic field and the sum of the phase of the shielding magnetic field generated by the first shielding device 140 and the phase of the shielding magnetic field generated by the second shielding device 130 have a phase-difference of 180°.

The second shielding device 130 may have the same configuration as the first shielding device 140, or may have a configuration at least partially different from that of the first shielding device 140. A more detailed description thereof will be given later.

Figure 2:
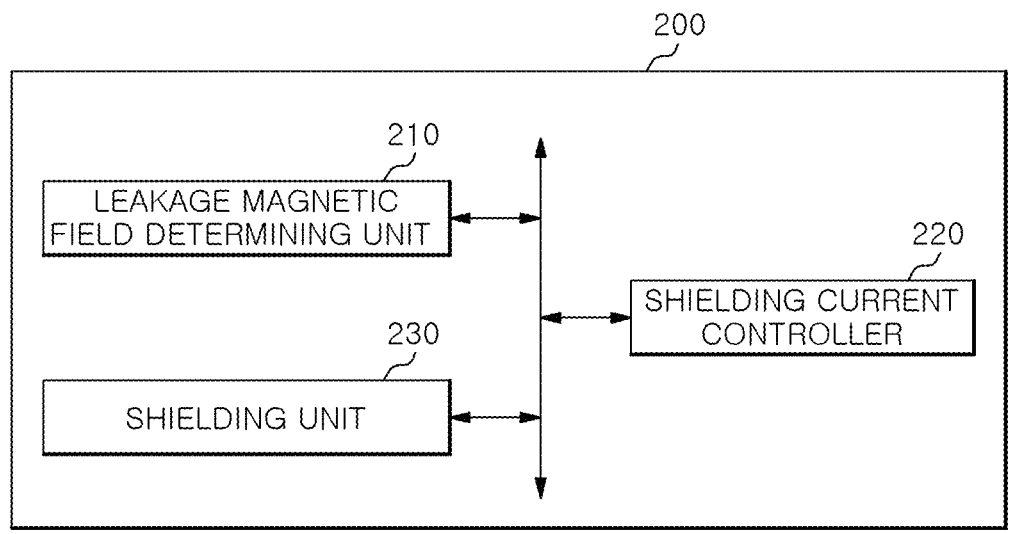
FIG. 2 shows an example of a functional configuration of a leakage magnetic field shielding device according to an embodiment of the present disclosure.

FIG. 2 shows an example of a functional configuration of a leakage magnetic field shielding device according to an embodiment of the present disclosure. The term ". . . unit" used below refers to a unit that processes at least one function or operation, which may be implemented by hardware or software, or a combination of hardware and software. Hereinafter, in the description of FIG. 2, the descriptions which have been made with reference to FIG. 1 will be omitted.

Referring to FIG. 2, a shielding device (leakage magnetic field shielding device) 200 comprises a leakage magnetic field determining unit 210, a shielding current controller 220, and a shielding unit 230.

The leakage magnetic field determining unit 210 determines a phase and a magnitude of a leakage magnetic field based on information obtained from each of the power supply device 110 and the current collector device 120.

In some cases, the leakage magnetic field determination unit 210 may obtain information about the phase and the magnitude of the primary magnetic field generated by the power supply device 110 from the power supply device 110. Further, the leakage magnetic field determination unit 210 may obtain information about the phase and the magnitude of the secondary magnetic field generated by the current collector device 120 from the current collector device 120.

The leakage magnetic field determining unit can determine a phase and a magnitude of a leakage magnetic field based on information about the phase and the magnitude of each of the primary and the secondary magnetic field generated by the power supply device 110 and the current collector device 120. The current collector device 120 generates a magnetic field by an induction voltage induced in the current collector device 120. Specifically, the leakage magnetic field determining unit 210 calculates a synthetic vector of a vector representing a phase and a magnitude of a primary magnetic field generated by the power supply device 110 and a vector representing a phase and a magnitude of a secondary magnetic field generated by the current collector device 120.

The leakage magnetic field determining unit 210 determines the magnitude of the calculated synthetic vector as the magnitude of the leakage magnetic field, and determines the phase of the calculated synthetic vector as the phase of the leakage magnetic field.

The shielding current controller 220 determines a shielding current based on the phase and the magnitude of the leakage magnetic field and supplies the determined shielding current to the shielding device 200. Specifically, the shielding current controller 220 determines as the shielding magnetic field a magnetic field having a phase difference of 180° from the phase of the leakage magnetic field and having the same magnitude as that of the leakage magnetic field. The magnetic field having a phase difference of 180° from the phase of the leakage magnetic field and having the same magnitude as that of the leakage magnetic field serves as the shielding magnetic field for shielding the leakage magnetic field.

The shielding unit 230 shields the leakage magnetic field by generating a shielding magnetic field based on the supply of the shielding current. When the shielding current is supplied to the shielding unit 230, the shielding unit 230 generates a shielding magnetic field. The shielding magnetic field generated by the shielding unit 230 serves to shield the leakage magnetic field.

The shielding unit 230 includes a capacitor and a coil. The shielding unit 230 has multiple resonance characteristics depending on the arrangement of the capacitor and the coil. The multiple resonance means resonance at two or more different frequencies.

The shielding unit 230 generates a shielding magnetic field having a plurality of resonance frequencies canceling each of the magnetic fields corresponding to the fundamental frequency and the multiple frequency of the leakage magnetic field based on the multiple resonance characteristics.

For example, the shielding unit 230 may have a resonance frequency of 5 MHz and 20 MHz when the fundamental frequency of the leakage magnetic field is 6.78 MHz and the multiple frequency is 20.34 MHz. Therefore, the shielding unit 230 may generate a shielding magnetic field having frequencies of 6.78 MHz and 20.34 MHz, which are respectively the same as the fundamental frequency and the multiple frequency of the leakage magnetic field. The shielding unit 230 shields the leakage magnetic field by using the generated shielding magnetic field. The multiple frequency indicates a frequency corresponding to an integer multiple of the fundamental frequency.

The shielding unit 230 includes the first shielding device 140 and the second shielding device 130 shown in FIG. 1. In this case, each of the first shielding device 140 and the second shielding device 130 of the shielding unit 230 includes at least one capacitor and at least one coil. Each of the first shielding device 140 and the second shielding device 130 has a multiple resonance characteristic, so that the shielding magnetic field for shielding the fundamental frequency component and the multiple frequency component of the leakage magnetic field is generated by the first shielding device 140 and the second shielding device 130.

Figure 3:
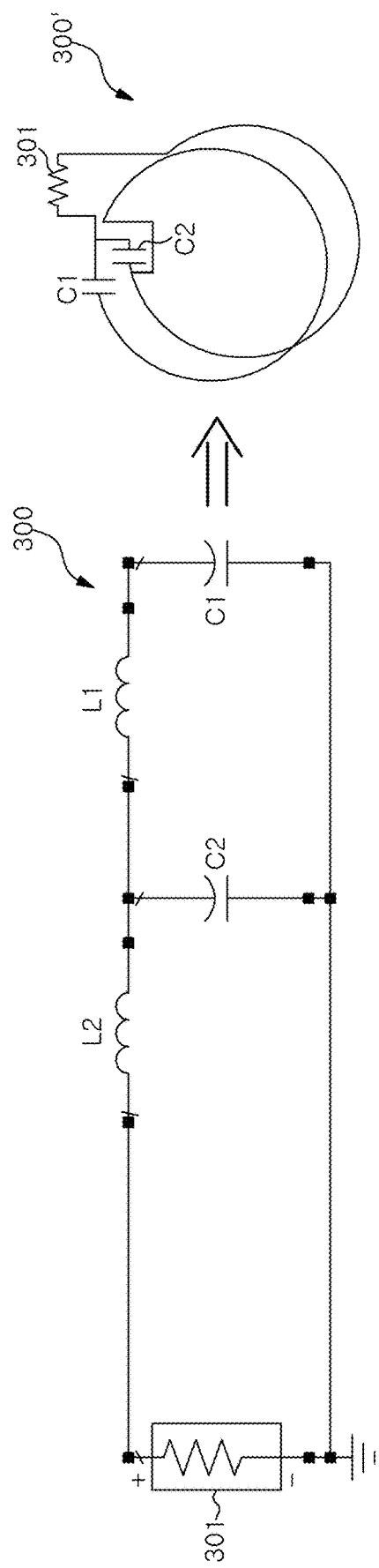
FIG. 3 shows an example of a circuit configuration of the leakage magnetic field shielding device according to the embodiment of the present disclosure.

FIG. 3 shows an example of a circuit configuration of a shielding device according to an embodiment of the present disclosure. Specifically, the shielding device 300 shows an example of a circuit configuration of the first shielding device 140 or the second shielding device 130 shown in FIG. 1. The circuit configuration may also be referred to as a shield coil.

Referring to FIG. 3, the shielding device 300 includes a plurality of capacitors C1 and C2 and a plurality of coils L1 and L2. Specifically, the shielding device 300 includes C1 and L1 connected in series. C1 and L1 connected in series are connected in parallel with C2. C1, L1 and C2 connected in the above-described manner are connected in series with L2. The shielding device 300 has multiple resonance characteristics by a connection relationship between the capacitors C1 and C2 and the coils L1 and L2.

The shielding device 300 includes a power source 301 that supplies a shielding current in addition to the capacitors C1 and C2 and the coils L1 and L2. When a current is supplied to the shielding device 300 by the power source 301, the shielding device 300 generates a shielding magnetic field having a plurality of different resonant frequencies based on the connection relationship between the capacitors C1 and C2 and the coils L1 and L2.

Such a shielding device 300 may be conceptually shown as a shielding device 300' of FIG. 3. Although not shown, when the shielding device 300' is applied to the first shielding device 140, the power supply device 110 is positioned inside the shielding device 300'. When the shielding device 300' is applied to the second shielding device 130, the current collector device 120 is positioned inside the shielding device 300'.

The shielding device 300 may be applied to both the first shielding device 140 and the second shielding device 130, and may be applied to only one of the first shielding device 140 and the second shielding device 130.

Figure 4:
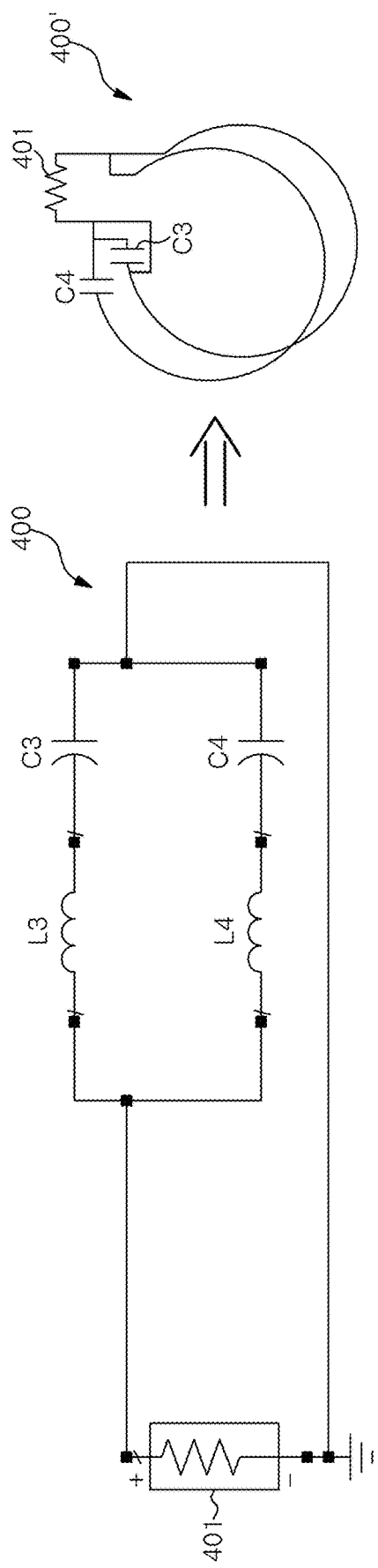
FIG. 4 shows an example of a circuit configuration of the leakage magnetic field shielding device according to another embodiment of the present disclosure.

FIG. 4 shows an example of a circuit configuration of a shielding device according to an embodiment of the present disclosure. Specifically, the shielding device 400 shows an example of a circuit configuration of the first shielding device 140 or the second shielding device 130 shown in FIG. 1. The circuit configuration may also be referred to as a shield coil.

Referring to FIG. 4, the shielding device 400 includes a plurality of capacitors C3 and C4 and a plurality of coils L3 and L4. Specifically, the shielding device 400 includes C4 and L4 connected in series, and C3 and L3 connected in series. C4 and L4 connected in series are connected in parallel with C3 and L3 connected in series. The shielding device 400 has multiple resonance characteristics by a connection relationship between the capacitors C3 and C4 and the coils L3 and L4.

The shielding device 400 includes a power source 401 that supplies a shielding current in addition to the capacitors C3 and C4 and the coils L3 and L4. When a current is supplied to the shielding device 400 by the power source 401, the shielding device 400 generates a shielding magnetic field having a plurality of different resonant frequencies based on the connection relationship between the capacitors C3 and C4 and the coils L3 and L4.

Such a shielding device 400 may be conceptually shown as a shielding device 400' of FIG. 4. Although not shown, when the shielding device 400' is applied to the first shielding device 140, the power supply device 110 is positioned inside the shielding device 400'. When the shielding device 400' is applied to the second shielding device 130, the current collector device 120 is positioned inside the shielding device 400'.

The shielding device 400 may be applied to both the first shielding device 140 and the second shielding device 130, and may be applied to only one of the first shielding device 140 and the second shielding device 130.

Figure 5:
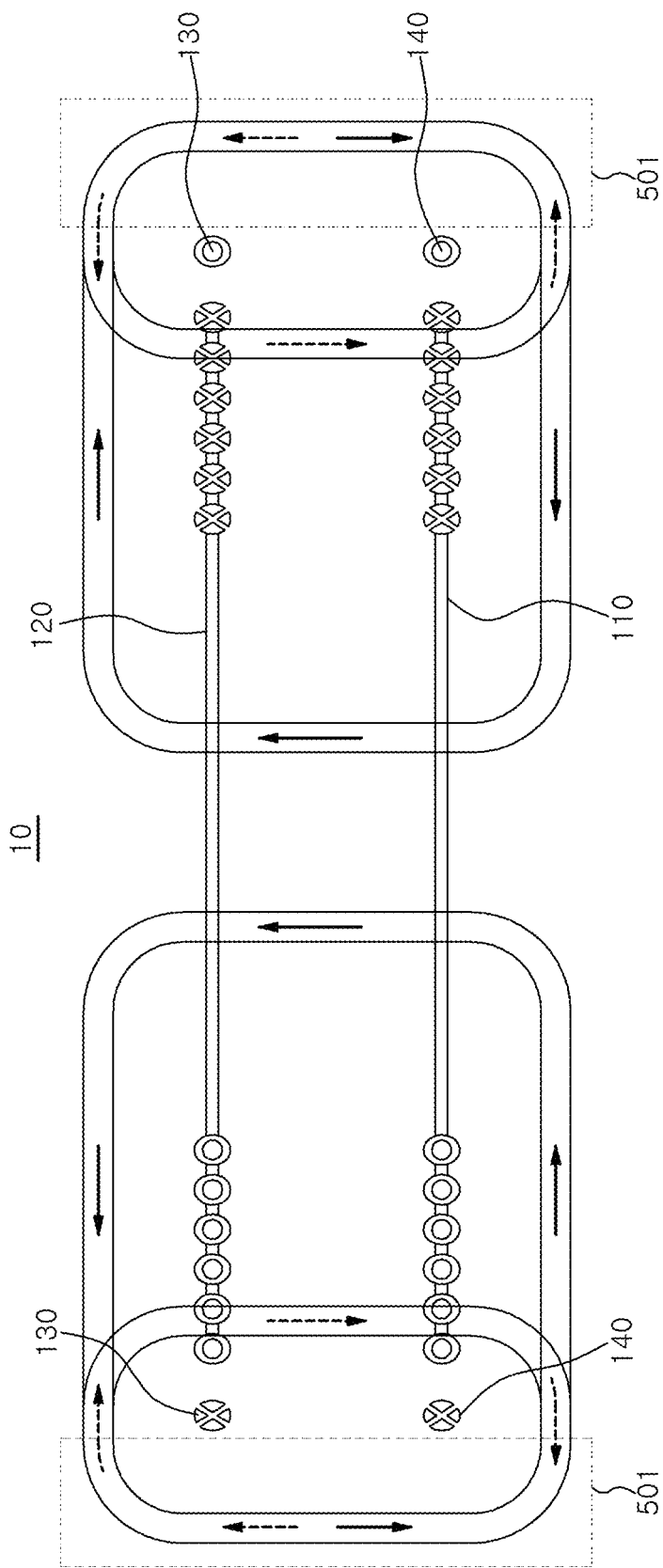
FIG. 5 is a conceptual diagram illustrating a magnetic field flow generated by the wireless power transmission system according to the embodiment of the present disclosure.

FIG. 5 is a conceptual diagram illustrating a magnetic field flow generated by a wireless power transmission system according to an embodiment of the present disclosure. Specifically, FIG. 5 is a diagram illustrating a flow of a magnetic field based on a cross section of the wireless power transmission system of FIG. 1.

Referring to FIG. 5, the power supply device 110 generates a primary magnetic field to supply electrical energy to the current collector device 120. The primary magnetic field flows in a direction from the power supply device 110 to the current collector 120. A voltage may be induced in the current collector device 120 by the primary magnetic field, and the current collector device 120 receives electric energy from the power supply device 110 to perform a wireless charging process.

The coil of the power supply device 100 and the coil of the current collector device 120 may be overlapped multiple times, and the current may flow counterclockwise for each of the power supply device 100 and the current collector device 120.

In this case, as shown in FIG. 5, which shows a cross section of the wireless power transmission system 10, the symbol x indicating the current flow-in for each coil is indicated on the right side of each of the power supply device 100 and the current collector device 120. The symbol o indicating the current flow-out for each coil is indicated on the left side of each of the power supply device 100 and the current collector device 120.

The first shielding device 140 is located outside the power supply device 110, and the second shielding device 130 is located outside the current collector device 120. In FIG. 5 taken based on the cross section of the wireless power transmission system 10, the first shielding device 140 is located at the left and right sides of the power supply device 110, the second shielding device 130 is located at the left and right sides of the current collector device 120.

Meanwhile, in a wireless charging process in which electrical energy is supplied from the power supply device 110 to the current collector device 120, a leakage magnetic field may be generated at a certain portion. Specifically, for example, a leakage magnetic field may occur in the leakage portion 501 shown in FIG. 5. The shielding devices 130 and 140 can create a shielding magnetic field that cancels the leakage magnetic field.

For example, the shielding devices 130 and 140 can allow current to flow clockwise therein to generate a shielding magnetic field. In this case, as shown in FIG. 5, the symbol x indicating the current flow-in is indicated on the left side of the shielding devices 130 and 140, and the symbol o indicating the current flow-out is indicated on the right side of the shielding devices 130 and 140.

The shielding magnetic field is a magnetic field having a magnitude corresponding to the magnitude of the leakage magnetic field in the leakage portion 501 while having a phase opposite to the phase of the leakage magnetic field, that is, while having a phase difference of 180° from the leakage magnetic field. Accordingly, the leakage magnetic field can be shielded by the shielding magnetic field.

Although not specifically illustrated, the leakage magnetic field may include a multiple frequency component in addition to the fundamental frequency component of the primary magnetic field used for wireless charging.

As will be described later, the shielding device according to an embodiment of the present disclosure may have multiple resonance characteristics depending on the arrangement of the capacitor and the coil. Therefore, the shielding device can generate a shielding magnetic field that includes a first frequency component that cancels the fundamental frequency component of the leakage magnetic field and a second frequency component that cancels the multiple frequency component. The first frequency component has a frequency value corresponding to the fundamental frequency value of the leakage magnetic field, and the second frequency component has a frequency value corresponding to the multiple frequency value of the leakage magnetic field.

The leakage magnetic field may have a plurality of multiple frequencies. The leakage magnetic field may have, for example, frequencies corresponding to twice, three times and four times the fundamental frequency. In this case, the first frequency component of the shielding magnetic field has a frequency value corresponding to the fundamental frequency value of the leakage magnetic field, and the second frequency component has a frequency value corresponding to twice the fundamental frequency value of the leakage magnetic field, the third frequency component has a frequency value corresponding to three times the fundamental frequency value of the leakage magnetic field, and the fourth frequency component has a frequency value corresponding to four times the fundamental frequency value of the leakage magnetic field.

Figure 6:
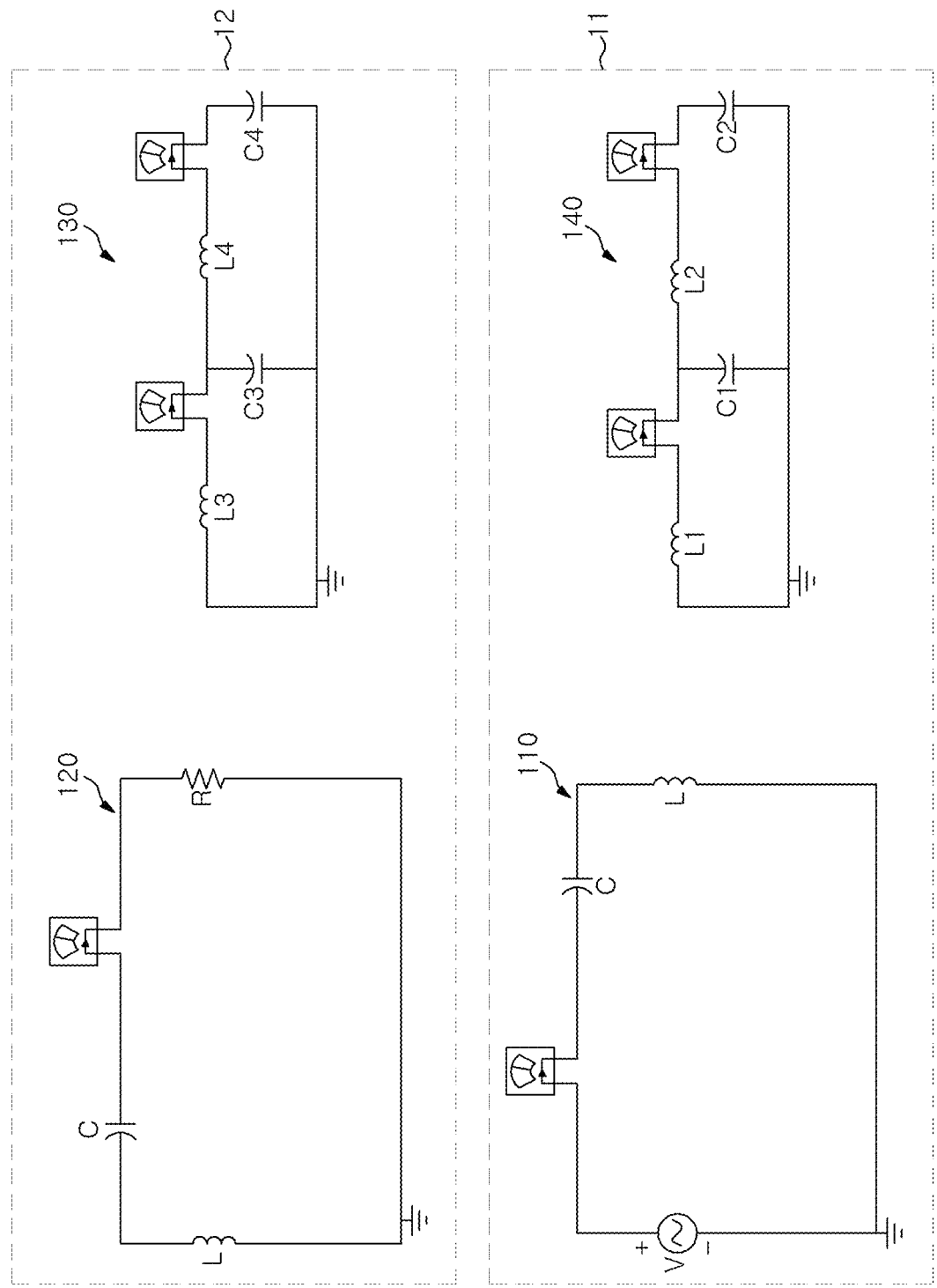
FIG. 6 shows an example of a circuit configuration of the wireless power transfer system according to an embodiment of the present disclosure.

FIG. 6 shows an example of a circuit configuration of the wireless power transfer system according to one embodiment of the present disclosure. Specifically, FIG. 6 is a diagram for conceptually describing a circuit configuration of the wireless power transmission system 10 when the first shielding device 140 and the second shielding device 130 have the circuit configuration shown in FIG. 3.

Referring to FIG. 6, the power supply unit 11 includes the power supply device 110 and the first shielding device 140. The first shielding device 140 comprises a circuit including the capacitors C1 and C2 and the coils L1 and L2 as shown in FIG. 6, and is located on the same plane as the power supply device 110. Meanwhile, although the power supply device 110 and the first shielding device 140 are arranged side by side in FIG. 6, the first shielding device 140 may be arranged in a form of an overlapped circuit as shown in FIG. 3. In this case, the power supply device 110 may be located in the internal space of the first shielding device 140.

The current collector unit 12 includes the current collector device 120 and the second shielding device 130. The second shielding device 130 comprises a circuit including the capacitors C3 and C4 and the coils L3 and L4 as shown in FIG. 6, and is located on the same plane as the current collector device 120. Meanwhile, although the current collector device 120 and the second shielding device 130 are arranged side by side in FIG. 6, the second shielding device 130 may be arranged in a form of an overlapped circuit as shown in FIG. 3. In this case, the current collector device 120 may be located in the internal space of the second shielding device 130.

Figure 7:
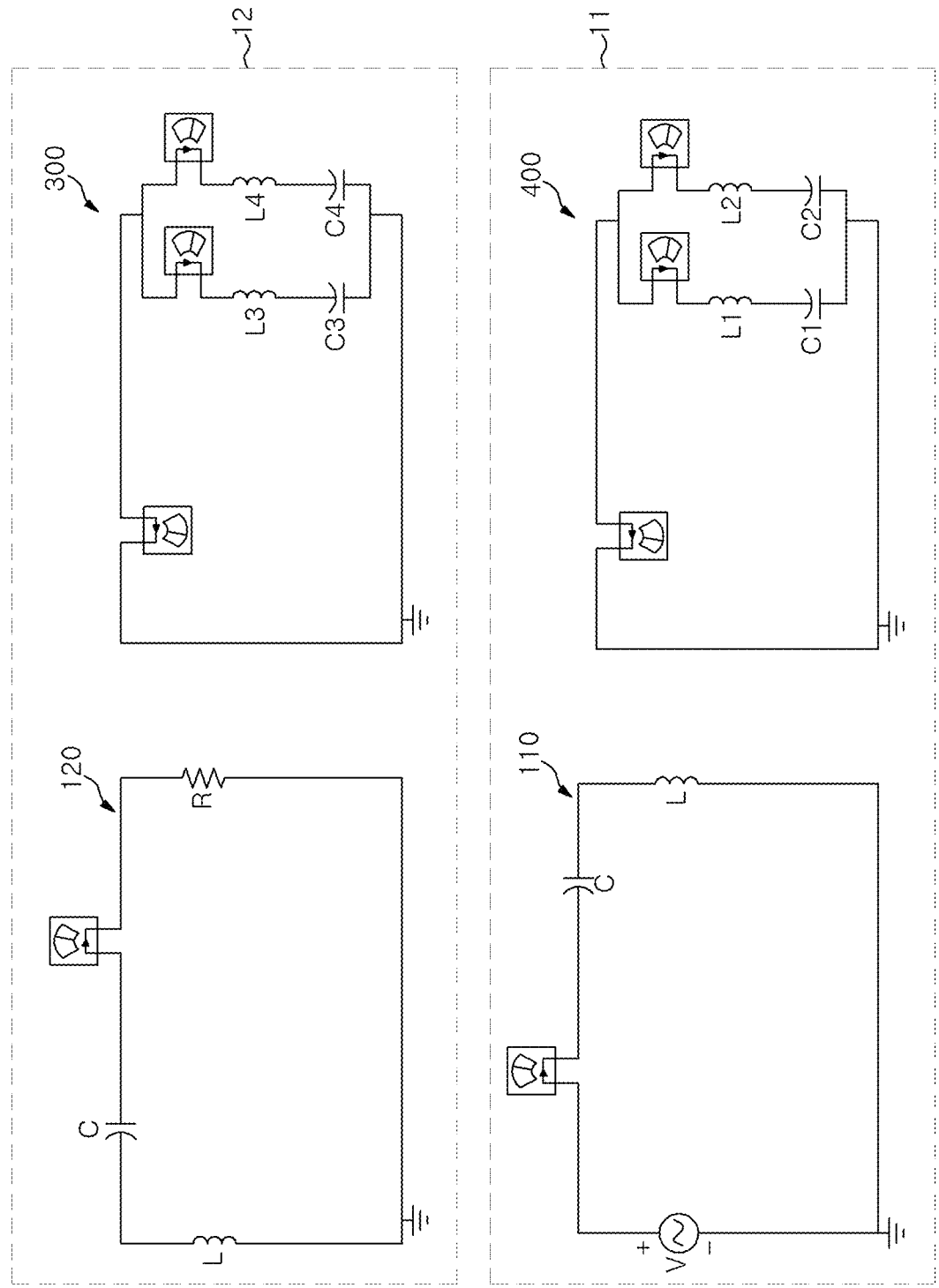
FIG. 7 shows an example of a circuit configuration of the wireless power transfer system according to another embodiment of the present disclosure.

FIG. 7 shows an example of a circuit configuration of the wireless power transfer system according to another embodiment of the present disclosure. Specifically, FIG. 7 is a diagram for conceptually describing a circuit configuration of the wireless power transmission system 10 when the first shielding device 140 and the second shielding device 130 have the circuit configuration shown in FIG. 4.

Referring to FIG. 7, the power supply unit 11 includes the power supply device 110 and the first shielding device 400. The first shielding device 400 comprises a circuit including the capacitors C1 and C2 and the coils L1 and L2 as shown in FIG. 6, and is located on the same plane as the power supply device 110. Meanwhile, although the power supply device 110 and the first shielding device 140 are arranged side by side in FIG. 7, the first shielding device 140 may be arranged in a form of an overlapped circuit as shown in FIG. 4. In this case, the power supply device 110 may be located in the internal space of the first shielding device 140.

The current collector unit 12 includes the current collector device 120 and the second shielding device 300. The second shielding device 130 comprises a circuit including the capacitors C3 and C4 and the coils L3 and L4 as shown in FIG. 7, and is located on the same plane as the current collector device 120. Meanwhile, although the current collector device 120 and the second shielding device 130 are arranged side by side in FIG. 7, the second shielding device 130 may be arranged in a form of an overlapped circuit as shown in FIG. 4. In this case, the current collector device 120 may be located in the internal space of the second shielding device 130.

Combinations of blocks in the flowcharts of the present disclosure can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the steps of the flowchart.

These computer program instructions may also be stored in a computer usable or computer readable memory that can direct a computer or other programmable data processing apparatuses to function in a particular manner, such that the instructions stored in the computer usable or computer readable medium can produce an article of manufacture including instructions which implement the function specified in the blocks of the flowcharts.

The computer program instructions may also be loaded onto a computer or other programmable data processing apparatuses to cause a series of operational steps to be performed on the computer or other programmable apparatuses to produce a computer implemented process such that the instructions which execute on the computer or other programmable apparatuses provide processes for implementing the functions specified in the blocks of the flowcharts.

Each block in the flowchart may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

While the present disclosure has been shown and described with respect to the embodiments, it will be understood by those skilled in the art that various changes and modifications may be made without departing from the scope of the present disclosure as defined in the following claims.

What is claimed is:

1. A leakage magnetic field shielding device comprising:
   a leakage magnetic field determining unit configured to determine a phase and a magnitude of a leakage magnetic field based on information obtained from each of a power supply device and a current collector device;
   a shielding current controller configured to determine a shielding current based on the phase and the magnitude of the leakage magnetic field and to supply the determined shielding current to the leakage magnetic field shielding device; and
   a shielding unit configured to shield the leakage magnetic field by generating a shielding magnetic field in accordance with the supply of the shielding current,
   wherein the shielding unit has a multiple resonance characteristic depending on an arrangement of a capacitor and a coil included in the shielding unit and is disposed to surround a coil of the power supply device or a coil of the current collector device, and
   the shielding magnetic field has a plurality of resonance frequencies canceling each of magnetic fields corresponding to a fundamental frequency and a multiple frequency of the leakage magnetic field based on the multiple resonance characteristic of the shielding unit.

2. The leakage magnetic field shielding device of claim 1, wherein the shielding unit includes a first capacitor, a second capacitor, a first coil and a second coil,
   the first capacitor is connected in series with the first coil,
   the second capacitor is connected in parallel with the first capacitor and the first coil connected in series, and
   the first capacitor and the first coil, connected in series, and the second capacitor connected in parallel therewith are connected in series with the second coil.

3. The leakage magnetic field shielding device of claim 1, wherein the shielding unit includes a first capacitor, a second capacitor, a first coil and a second coil,
   the first capacitor is connected in series with the first coil,
   the second capacitor is connected in series with the second coil, and
   the first capacitor and the first coil connected in series are connected in parallel with the second capacitor and the second coil connected in series.

4. The leakage magnetic field shielding device of claim 1, wherein the shielding unit is disposed to surround the coil of the power supply device on a plane where the coil of the power supply device is disposed, and
   the power supply device is positioned inside the shielding unit.

5. The leakage magnetic field shielding device of claim 1, wherein the shielding unit is disposed to surround the coil of the current collector device on a plane where the coil of the current collector device is disposed, and
   the current collector device is positioned inside the shielding unit.

6. The leakage magnetic field shielding device of claim 1, wherein the shielding unit includes a first shielding unit and a second shielding unit,
   the first shielding unit is disposed to surround the coil of the power supply device on a plane where the coil of the power supply device is disposed, the power supply device being positioned inside the first shielding unit, and
   the second shielding unit is disposed to surround the coil of the current collector device on a plane where the coil of the current collector device is disposed, the current collector device being positioned inside the second shielding unit.

7. The leakage magnetic field shielding device of claim 6, wherein at least one of the first shielding unit and the second shielding unit includes a first capacitor, a second capacitor, a first coil and a second coil,
   the first capacitor is connected in series with the first coil,
   the second capacitor is connected in series with the second coil, and
   the first capacitor and the first coil connected in series are connected in parallel with the second capacitor and the second coil connected in series.

8. The leakage magnetic field shielding device of claim 6, wherein at least one of the first shielding unit and the second shielding unit includes a first capacitor, a second capacitor, a first coil and a second coil,
   the first capacitor is connected in series with the first coil,
   the second capacitor is connected in parallel with the first capacitor and the first coil connected in series, and
   the first capacitor and the first coil, connected in series, and the second capacitor connected in parallel therewith are connected in series with the second coil.

9. A wireless power transmission system comprising:
   a power supply device including a coil, the power supply device serving to generate a primary magnetic field when current is applied to the coil of the power supply device;
   a current collector device including a coil, the current collector device serving to receive a power by an induction voltage induced at both ends of the coil of the current collector device by the generated primary magnetic field; and a leakage magnetic field shielding device which comprises:

a leakage magnetic field determining unit configured to determine a phase and a magnitude of a leakage magnetic field based on information obtained from each of the power supply device and the current collector device;

a shielding current controller configured to determine a shielding current based on the phase and the magnitude of the leakage magnetic field and to supply the determined shielding current to the leakage magnetic field shielding device; and a shielding unit configured to shield the leakage magnetic field by generating a shielding magnetic field in accordance with the supply of the shielding current, wherein the shielding unit has a multiple resonance characteristic depending on an arrangement of a capacitor and a coil included in the shielding unit and is disposed to surround a coil of the power supply device or a coil of the current collector device, and the shielding magnetic field has a plurality of resonance frequencies canceling each of the magnetic fields corresponding to a fundamental frequency and a multiple frequency of the leakage magnetic field based on the multiple resonance characteristic of the shielding unit.

10. The wireless power transmission system of claim 9, wherein the shielding unit includes a first capacitor, a second capacitor, a first coil and a second coil, the first capacitor and the first coil are connected in series, and the first capacitor and the first coil connected in series is connected in parallel with the second capacitor, and the first capacitor and the first coil, connected in series, and the second capacitor connected in parallel therewith are connected in series with the second coil.

11. The wireless power transmission system of claim 9, wherein the shielding unit includes a first capacitor, a second capacitor, a first coil and a second coil, the first capacitor is connected in series with the first coil, the second capacitor is connected in series with the second coil, and the first capacitor and the first coil connected in series are connected in parallel with the second capacitor and the second coil connected in series.

12. The wireless power transmission system of claim 9, wherein the shielding unit is disposed to surround the coil of the power supply device on a plane where the coil of the power supply device is disposed, and the power supply device is positioned inside the shielding unit.

13. The wireless power transmission system of claim 9, wherein the shielding unit is disposed to surround the coil of the current collector device on a plane where the coil of the current collector device is disposed, and the current collector device is positioned inside the shielding unit.

14. The wireless power transmission system of claim 9, wherein the shielding unit includes a first shielding unit and a second shielding unit, the first shielding unit is disposed to surround the coil of the power supply device on a plane where the coil of the power supply device is disposed, the power supply device being positioned inside the first shielding unit, and the second shielding unit is disposed to surround the coil of the current collector device on a plane where the coil of the current collector device is disposed, the current collector device being positioned inside the second shielding unit.

15. The wireless power transmission system of claim 14, wherein at least one of the first shielding unit and the second shielding unit includes a first capacitor, a second capacitor, a first coil and a second coil, the first capacitor and the first coil are connected in series, and the first capacitor and the first coil connected in series is connected in parallel with the second capacitor, and the first capacitor and the first coil, connected in series, and the second capacitor connected in parallel therewith are connected in series with the second coil.

16. The wireless power transmission system of claim 14, wherein at least one of the first shielding unit and the second shielding unit includes a first capacitor, a second capacitor, a first coil and a second coil, the first capacitor is connected in series with the first coil, the second capacitor is connected in parallel with the first capacitor and the first coil connected in series the second coil, and the first capacitor and the first coil connected in series with are connected in parallel with the second capacitor and the second coil connected in series.

\* \* \* \* \*